(12) United States Patent
Moriwaka

(10) Patent No.: US 8,168,510 B2
(45) Date of Patent: May 1, 2012

(54) METHOD FOR MANUFACTURING SEMICONDUCTOR LAYER AND SEMICONDUCTOR DEVICE

(75) Inventor: Tomoaki Moriwaka, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 30 days.

(21) Appl. No.: 12/546,173

(22) Filed: Aug. 24, 2009

(65) Prior Publication Data

US 2010/0055872 A1 Mar. 4, 2010

(30) Foreign Application Priority Data

Aug. 28, 2008 (JP) ................. 2008-219047

(51) Int. Cl.
*H01L 21/30* (2006.01)
(52) U.S. Cl. ................. 438/458; 438/795; 257/E21.568
(58) Field of Classification Search .................. 438/458, 438/795; 257/E21.568
See application file for complete search history.

(56) References Cited

U.S. PATENT DOCUMENTS

| | | | |
|---|---|---|---|
| 7,119,365 B2 | 10/2006 | Takafuji et al. | |
| 7,619,250 B2 | 11/2009 | Takafuji et al. | |
| 8,034,694 B2 | 10/2011 | Ohnuma et al. | |
| 8,044,296 B2 | 10/2011 | Yamazaki et al. | |
| 2009/0081845 A1* | 3/2009 | Yamazaki et al. | ............ 438/406 |
| 2010/0019242 A1 | 1/2010 | Takafuji et al. | |
| 2011/0124151 A1 | 5/2011 | Yamazaki et al. | |

FOREIGN PATENT DOCUMENTS

JP 2004-087606 A 3/2004

* cited by examiner

*Primary Examiner* — Alexander Ghyka
*Assistant Examiner* — Stanetta Isaac
(74) *Attorney, Agent, or Firm* — Eric J. Robinson; Robinson Intellectual Property Law Office, P.C.

(57) ABSTRACT

An object is that a region separated from a semiconductor substrate when a supporting substrate is larger than the semiconductor substrate does not easily move. A method for manufacturing a semiconductor layer includes the steps of: irradiating a plurality of semiconductor substrates with ions to form embrittlement layers in the plurality of semiconductor substrates; forming bonding layers on respective surfaces of the plurality of semiconductor substrates; placing, over a supporting substrate, the surfaces of the plurality of semiconductor substrates on which the bonding layers are formed; placing a cover including depressed portions which house the plurality of semiconductor substrates over the plurality of semiconductor substrates; and heating the plurality of semiconductor substrates housed in the depressed portions of the cover, and thereby collecting semiconductor layers fixed to the supporting substrate, and regions separated from the plurality of semiconductor substrates along with the embrittlement layers.

24 Claims, 7 Drawing Sheets

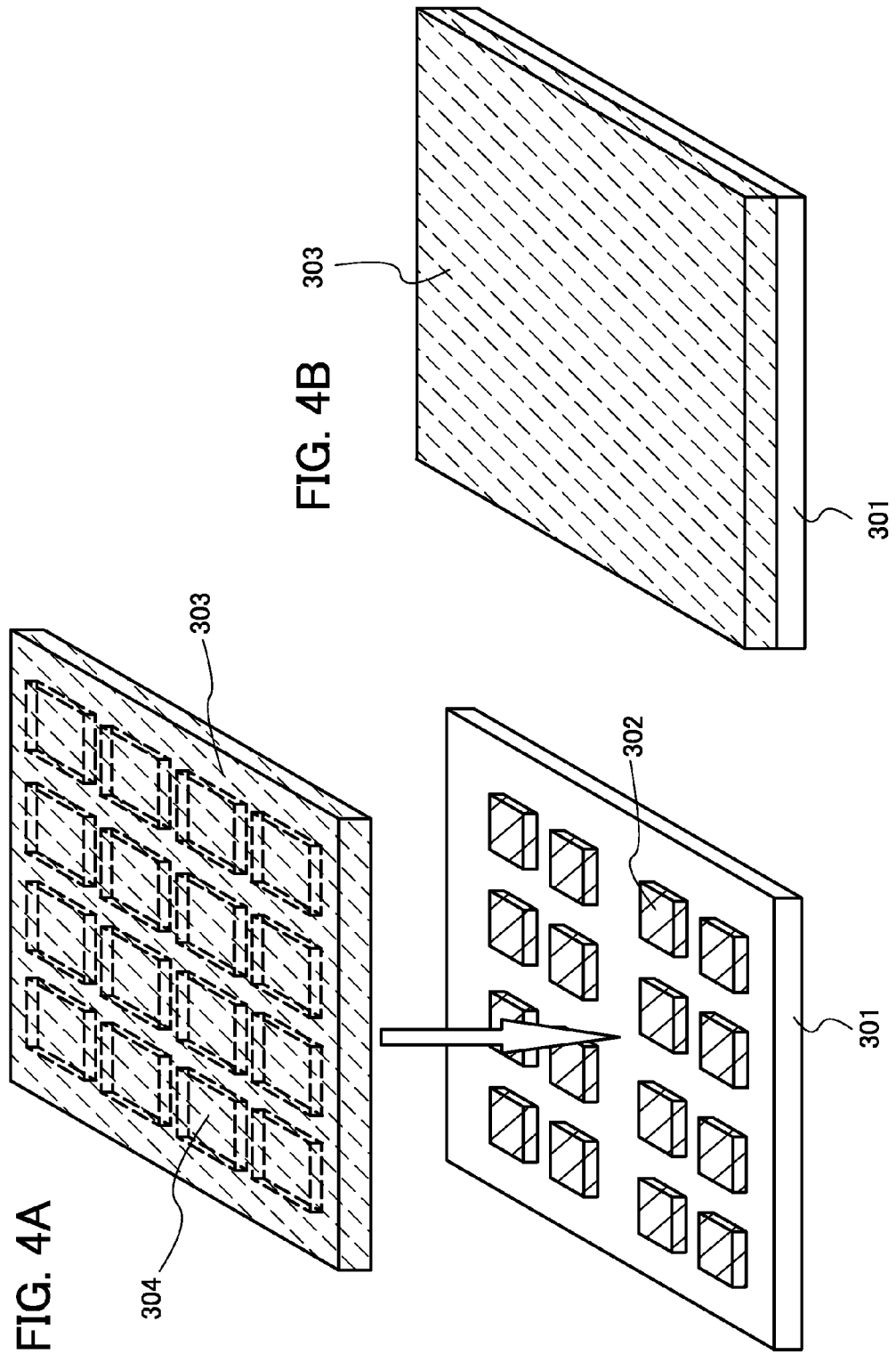

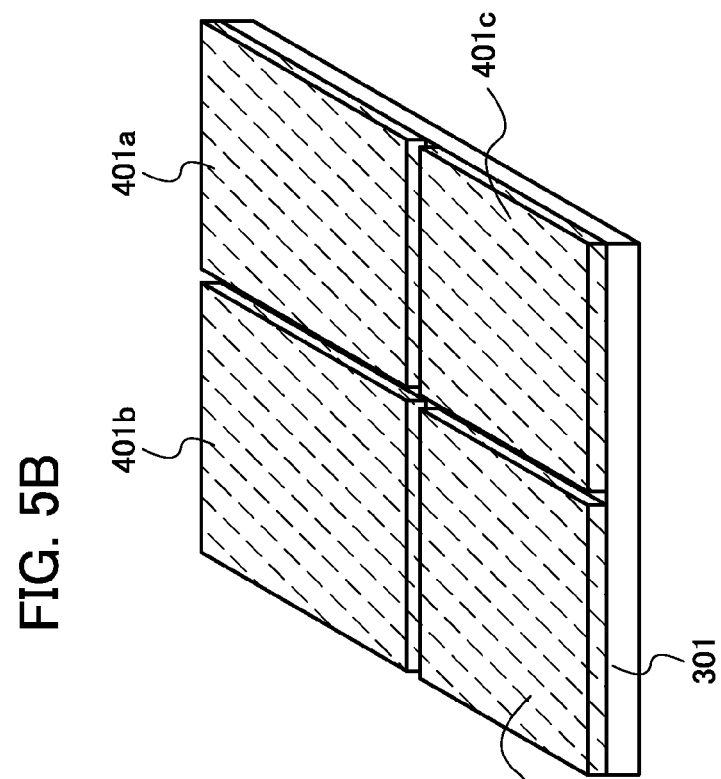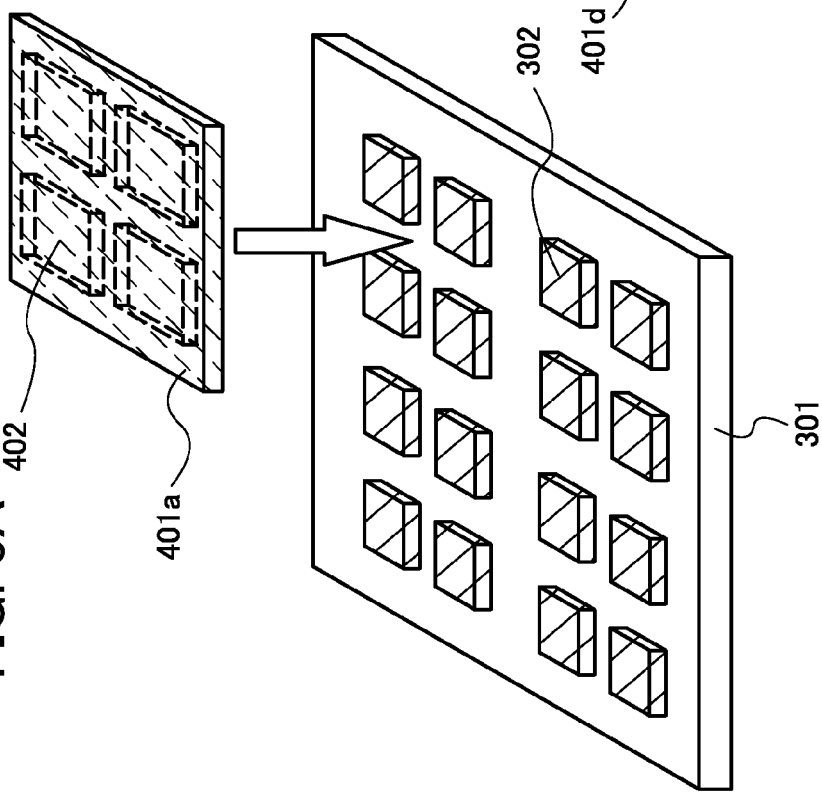

METHOD FOR MANUFACTURING SEMICONDUCTOR LAYER AND SEMICONDUCTOR DEVICE

BACKGROUND OF THE INVENTION

1. Field of the Invention

The present invention disclosed in this specification relates to a method for manufacturing a semiconductor layer.

2. Description of the Related Art

In recent years, a technique for forming a semiconductor element such as a thin film transistor (TFT) having a semiconductor film (e.g., the thickness of about several nanometers to several hundreds of nanometers) formed over a substrate having an insulating surface such as glass has attracted attention.

Thin film transistors are widely used in electronic devices such as ICs and electro-optical devices, and their development especially as switching elements for image display devices has been accelerated.

Instead of silicon wafers that are manufactured by thinly cutting an ingot of a single crystal semiconductor, semiconductor substrates called silicon-on-insulator (SOI) substrates have been developed, which have a thin single crystal semiconductor layer over an insulating layer and are becoming widely used as substrates for manufacturing microprocessors or the like.

This is because an integrated circuit using an SOI substrate has attracted attention as a circuit which reduces parasitic capacitance between a drain of a transistor and the substrate, improves performance of a semiconductor integrated circuit, and reduces power consumption.

As a method for manufacturing an SOI substrate, a hydrogen ion implantation separation method is known. For example, ions of hydrogen or the like are implanted to a silicon wafer provided with a silicon oxide film on its surface. Accordingly, a microbubble layer can be formed at a predetermined depth from the surface of the silicon wafer. This microbubble layer serves as a cleavage plane, and a thin single crystal silicon layer is bonded to another silicon wafer. Then, the single crystal silicon layer is separated from the cleavage plane by heat treatment to form an SOI substrate.

In addition, there is an attempt to form an SOI layer over an insulating substrate such as a glass substrate. As an example, a method in which a thin single crystal silicon layer is formed over a glass substrate by an ion implantation separation method is known (see Reference 1: Japanese Published Patent Application No. 2004-87606).

SUMMARY OF THE INVENTION

However, in the case where a large display is formed using an SOI substrate formed by an ion implantation separation method or the like, the size of a glass substrate greatly exceeds the size of a silicon wafer; therefore, the entire surface of the glass substrate cannot be covered with one silicon wafer.

That is, when a single crystal silicon layer is formed over a glass substrate for manufacturing a large display, one silicon wafer is insufficient, and a plurality of silicon wafers is needed.

For example, when rectangular wafers which are 200 mm wide and 200 mm long and are cut off from a wafer with a $\phi$ of 300 mm are arranged over a glass substrate which is 600 mm wide and 720 mm long, nine wafers are needed to be attached.

As described above, when a plurality of silicon wafers is attached to a glass substrate having a large area, a silicon wafer separated from an embrittlement layer by heat treatment might easily move over an air layer formed between separation planes. Therefore, when tiny amount of force or minute distortion of the glass substrate is generated, the silicon wafer might move outside a single crystal silicon layer formed over the glass substrate or might be detached from the glass substrate.

If the silicon wafer separated moves in this way, the single crystal silicon layer formed over the glass substrate might be damaged. In addition, when the glass substrate and the silicon wafer are collected by carrier devices after heat treatment, there arise problems in that the collection is difficult or the like.

Thus, after a plurality of semiconductor substrates each having an embrittlement layer (also referred to as a "separation layer") is attached to a large supporting substrate, a quartz cover is put on the semiconductor substrates attached. A depressed portion is formed on a surface of the quartz cover which is in contact with the semiconductor substrates or close to the semiconductor substrates so as to house the semiconductor substrates. The area of the depressed portion of the cover made from quartz is slightly larger than that of the semiconductor substrate. For example, in the case where the area of the semiconductor substrate is about equal to the area of the depressed portion, there might arise a problem in that a difference between coefficient of thermal expansion of semiconductor of the semiconductor substrate and that of quartz at the time of heating is caused and thus either the semiconductor or the quartz is broken, or the like. As described above, movement of the semiconductor substrate separated by heat treatment can be suppressed.

Note that a silicon wafer is used for the semiconductor substrate; however, a semiconductor used here is not limited to silicon. In addition, a substrate including germanium or a substrate including silicon and germanium may be used.

A glass substrate is mainly used as a supporting substrate, but is not limited to. Any substrate may be used as long as it has an insulating material, such as a quartz substrate or a sapphire substrate. Alternatively, a conductive substrate such as a stainless steel substrate or a semiconductor substrate a surface of which is covered with an insulating film may be used.

One embodiment of the present invention relates to a method for manufacturing a semiconductor layer, including the steps of: irradiating a plurality of semiconductor substrates with ions to form embrittlement layers in the plurality of semiconductor substrates; forming bonding layers on respective surfaces of the plurality of semiconductor substrates; placing, over a supporting substrate, the surfaces of the plurality of semiconductor substrates on which the bonding layers are formed; placing a cover including depressed portions which house the plurality of semiconductor substrates over the plurality of semiconductor substrates; and heating the plurality of semiconductor substrates housed in the depressed portions of the cover, and collecting semiconductor layers fixed to the supporting substrate, and regions separated from the plurality of semiconductor substrates along with the embrittlement layers.

When a single crystal semiconductor layer is formed from a plurality of silicon wafers over a glass substrate, movement of silicon wafers separated can be suppressed. Therefore, the single crystal semiconductor layer can be prevented from being damaged.

Thus, it is possible to determine the position of the silicon wafer after separation; therefore, the silicon wafer is easily collected and transferred by an automatic carrier device. Accordingly, a manufacturing apparatus of a single crystal semiconductor layer, which has a simpler apparatus structure and high processing ability at low cost, can be realized.

BRIEF DESCRIPTION OF THE DRAWINGS

FIGS. 4A and 4B are perspective views illustrating a method for manufacturing a semiconductor layer.

FIGS. 5A and 5B are perspective views illustrating a method for manufacturing a semiconductor layer.

DETAILED DESCRIPTION OF THE INVENTION

Figure 1A:
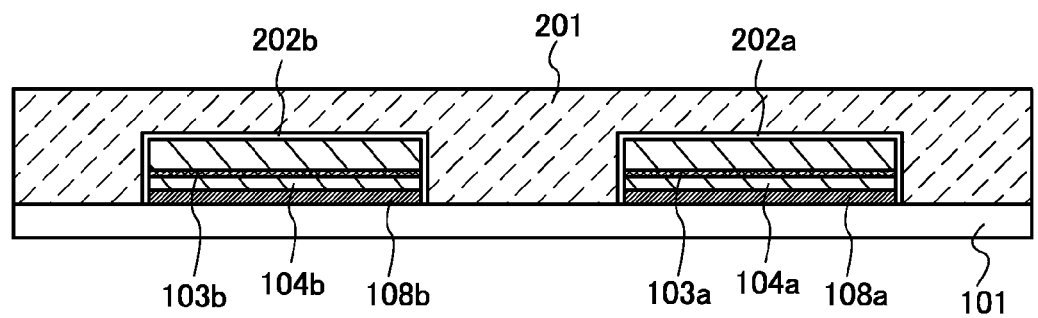
FIGS. 1A to 1C are cross-sectional views illustrating a method for manufacturing a semiconductor layer.
Figure 1B:
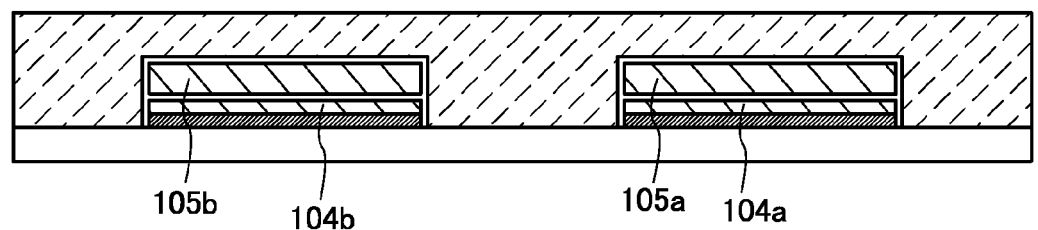

Hereinafter, the present invention will be fully described by way of embodiments with reference to the accompanying drawings. However, the present invention can be implemented with many different modes, and various changes and modifications for the modes and details thereof will be apparent to those skilled in the art unless such changes and modifications depart from the spirit and scope of the present invention. Therefore, the present invention should not be interpreted as being limited to what is described in the embodiments described below. Note that identical portions or portions having the same functions in the drawings are denoted by the same reference numerals and detailed descriptions thereof are omitted.

Note that in this specification, a semiconductor device means a device including a circuit having a semiconductor element (e.g., transistor or diode). Further, the semiconductor device may also mean every device that can function by using semiconductor characteristics.

Embodiment 1

This embodiment will be described with reference to FIGS. 1A to 1C, FIGS. 2A to 2D, FIGS. 3A to 3C, and FIGS. 7A to 7C.

First, a plurality of semiconductor substrates 102 is formed on an insulating surface 109. In this embodiment, a semiconductor substrate 102a and a semiconductor substrate 102b are formed on the insulating surface 109 (see FIG. 2A). In this embodiment, a silicon wafer is used as the semiconductor substrates 102; however, a semiconductor used here is not limited to silicon. A substrate including germanium or a substrate including silicon and germanium may be used. The insulating surface 109 may be a surface of an insulating substrate or a surface of a semiconductor substrate covered with an insulating film or a conductive substrate covered with an insulating film.

As the insulating substrate, any substrate may be used as long as it is formed using an insulating material, such as a glass substrate, a quartz substrate, or a sapphire substrate, for example. In addition, a stainless steel substrate or the like may be used for the conductive substrate. Further, a silicon substrate or the like may be used for the semiconductor substrate. A single-layer film or a stack of silicon oxide, silicon nitride, silicon oxynitride, or the like can be used for the insulating film to be formed on the top surface of the conductive substrate or the semiconductor substrate. Such an insulating film can be formed by a CVD method or a sputtering method.

A protective film 107a and a protective film 107b may be formed over the semiconductor substrates 102a and 102b, respectively. The protective films 107a and 107b are not necessarily formed, but the protective films 107a and 107b are preferably formed because the protective films can prevent the semiconductor substrates 102a and 102b from being contaminated by an impurity such as metal and the surfaces of these from being damaged by impacts of irradiation ions in a later ion irradiation step by which an embrittlement layer 103a and an embrittlement layer 103b are formed.

The protective films 107a and 107b can be a single-layer film or a multi-layer film formed by depositing an insulating material such as a silicon oxide film, a silicon nitride film, a silicon nitride oxide film, or a silicon oxynitride film by a CVD method or the like. Alternatively, the protective films can be formed by thermal oxidation of each surface of the semiconductor substrates 102a and 102b.

Note that in this specification, oxynitride is a substance that contains more oxygen than nitrogen, and nitride oxide is a substance that contains more nitrogen than oxygen. For example, silicon oxynitride means a substance that includes oxygen, nitrogen, silicon, and hydrogen at concentrations ranging from 55 at. % to 65 at. %, 1 at. % to 20 at. %, 25 at. % to 35 at. %, and 0.1 at. % to 10 at. %, respectively. Further, silicon nitride oxide means a substance that includes oxygen, nitrogen, silicon, and hydrogen at concentrations ranging from 15 at. % to 30 at. %, 20 at. % to 35 at. %, 25 at. % to 35 at. %, and 15 at. % to 25 at. %, respectively.

Figure 2A:
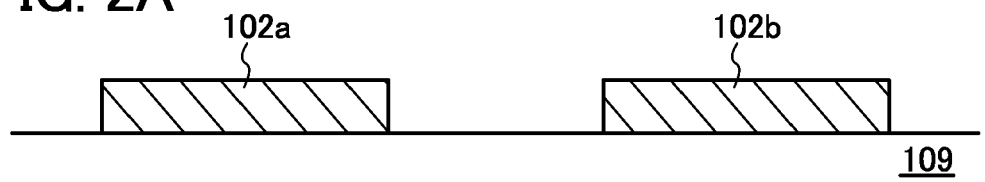
FIGS. 2A to 2D are cross-sectional views illustrating a method for manufacturing a semiconductor layer.
Figure 2B:
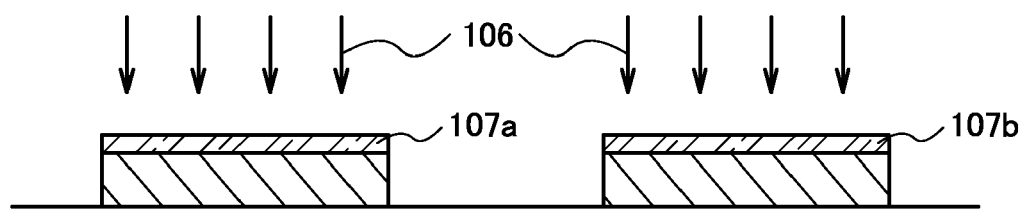
Figure 2C:

Next, the semiconductor substrates 102a and 102b are irradiated with ions 106 (see FIG. 2B), and the embrittlement layers 103a and 103b are formed in the semiconductor substrates 102a and 102b, respectively (see FIG. 2C). Note that in this specification, an "embrittlement layer" is also referred to as a "separation layer."

The embrittlement layers 103a and 103b are formed in regions at a predetermined depth of the semiconductor substrates 102a and 102b, respectively in such a way that the semiconductor substrates 102a and 102b are irradiated with the ions 106 accelerated by an electric field.

The depth of the embrittlement layers 103a and 103b formed in the semiconductor substrates 102a and 102b, respectively, can be controlled by the type of the ions 106 used for irradiation, the accelerating voltage of the ions 106, and the irradiation angle of the ions 106. The embrittlement layers 103a and 103b are formed in their respective regions at a depth which is close to an average penetration depth of the ions 106 from the surfaces of the semiconductor substrates 102a and 102b. The depth of each of the embrittlement layers 103a and 103b determines the thickness of a semiconductor layer to be transferred to a supporting substrate later. Therefore, the accelerating voltage and the dose of the ions at the time of irradiation with the ions 106 for forming the embrittlement layers 103a and 103b are adjusted in consideration of the thickness of the semiconductor layer to be transferred.

Irradiation with the ions 106 is preferably performed with an ion doping apparatus. In other words, an ion doping method is preferably used which performs irradiation with plural kinds of ions which are generated by plasma excitation of a source gas without any mass separation being performed. In this embodiment, irradiation with ions made up of one or a plurality of same atoms that have a single mass or ions made up of one or a plurality of same atoms that have different masses can be performed. Preferably, irradiation is performed with ions made up of one or a plurality of same atoms that have different masses.

As the ions 106, ions made up of one or a plurality of same atoms that have different masses, which are generated by plasma excitation of a source gas selected from hydrogen, deuterium, helium, or halogen such as fluorine are preferably used.

In the case of irradiation with hydrogen ions, it is preferable that $H^+$ ions, $H_2^+$ ions, and $H_3^+$ ions be contained in the hydrogen ions with a high percentage of $H_3^+$ ions. Thus, efficiency of the ion irradiation can be increased and time of the ion irradiation can be shortened. In the embrittlement layers 103a and 103b which are formed by locally irradiating the semiconductor substrate 102 with hydrogen at a high concentration, a crystal structure is disordered, whereby the embrittlement layers 103a and 103b each have a porous structure in which microvoids are formed.

Further, the embrittlement layers 103a and 103b can be formed in a similar manner even if ions are subjected to mass separation and the semiconductor substrates 102a and 102b are irradiated with a specific type of the ions 106. Also in this case, it is preferable to use ions with large mass (e.g., $H_3^+$ ions) for selective irradiation, which has a similar effect to the above.

As the source gas in the ion irradiation step, instead of a hydrogen gas, one or more kinds of gases selected from a noble gas such as a helium gas or an argon gas, a halogen gas typified by a fluorine gas or a chlorine gas, and a halogen compound gas such as a fluorine compound gas (e.g., $BF_3$) can be used. When helium is used for a source gas, irradiation with the ions 106 with high proportion of $He^+$ ions can be performed without mass separation.

Further, irradiation with the ions 106 can be performed not only one time but also a plurality of times.

A bonding layer 108a and a bonding layer 108b are formed on the surfaces of the semiconductor substrates 102a and 102b, respectively. Note that in the case where the protective films 107a and 107b formed from an insulating film are formed on the surfaces of the semiconductor substrates 102a and 102b, respectively, the protective films 107a and 107b may be removed before attachment to a large supporting substrate 101, or bonding layers may be formed over the protective films 107a and 107b without removal of the protective films 107a and 107b. In this embodiment, after the protective films 107a and 107b are removed, the bonding layers 108a and 108b are formed.

As each of the bonding layers 108a and 108b, an insulating film formed by chemical reaction is preferable, and specifically, a silicon oxide film is preferable. When the silicon oxide film of the bonding layers 108a and 108b are formed by a chemical vapor deposition (CVD) method, an organosilane gas is preferably used as a silicon source gas. An oxygen gas can be used as an oxygen source gas. As the organosilane gas, the following can be employed, such as ethyl silicate (tetraethoxysilane, TEOS: $Si(OC_2H_5)_4$), trimethylsilane (TMS: $(CH_3)_3SiH$), tetramethylsilane (TMS: $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), or trisdimethylaminosilane ($SiH(N(CH_3)_2)_3$).

Further, the bonding layers 108a and 108b can also be formed of low temperature oxide (LTO) which is formed at a heating temperature which is lower than or equal to 500° C. and higher than or equal to 200° C. by a thermal CVD method. In this case, silane ($SiH_4$), disilane ($Si_2H_6$), or the like can be used as the silicon source gas, and oxygen ($O_2$), dinitrogen monoxide ($N_2O$), or the like can be used as the oxygen source gas.

Figure 2D:
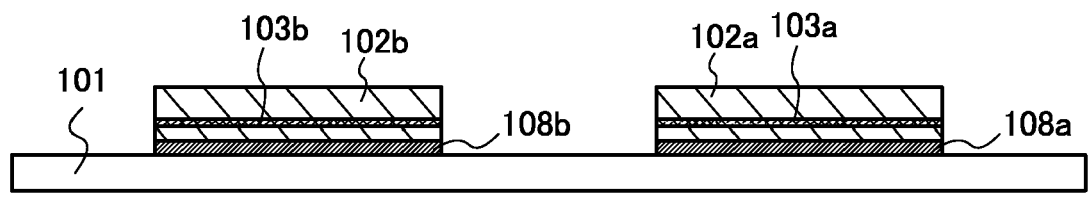

Next, the surfaces of the semiconductor substrates 102a and 102b on which the bonding layers 108a and 108b are formed are arranged over the large supporting substrate 101 (see FIG. 2D). In this embodiment, just two semiconductor substrates are used; however, the number of semiconductor substrates is not limited thereto, and three or more semiconductor substrates may be used.

The supporting substrate 101 may be a substrate formed from an insulating material, such as a glass substrate, a quartz substrate, or a sapphire substrate. In addition, a conductive substrate such as a stainless steel substrate, over which an insulating film is formed may be used. Further, a semiconductor substrate such as a silicon substrate, over which an insulating film is formed may be used. A single-layer film or a stack of silicon oxide, silicon nitride, or silicon oxynitride can be used for the insulating film to be formed on the top surface of the conductive substrate or the semiconductor substrate. Such an insulating film can be formed by a CVD method or a sputtering method. In this embodiment, a large glass substrate is used as the large supporting substrate 101.

The semiconductor substrates 102a and 102b are attached to the large supporting substrate 101 and heat treatment is performed, whereby volume change is generated in the minute voids formed in the embrittlement layers 103a and 103b, and a crack is generated. As a result, separation of the semiconductor substrates 102a and 102b is performed along the embrittlement layers 103a and 103b (see FIG. 3A).

Figure 3A:
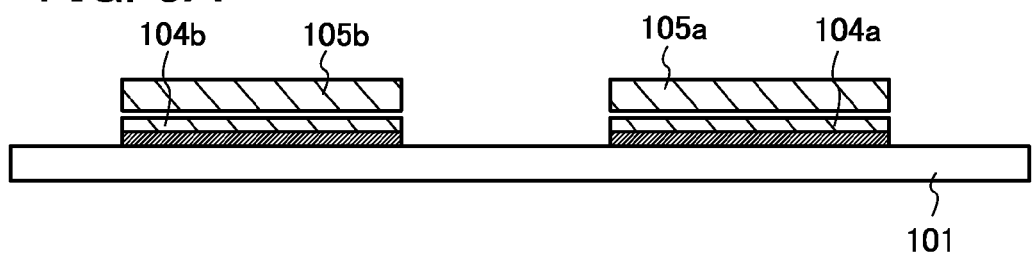
FIGS. 3A to 3C are cross-sectional views illustrating a method for manufacturing a semiconductor layer.
Figure 3B:

By this heat treatment, a thin film semiconductor layer 104a and a thin film semiconductor layer 104b, which are separated from the semiconductor substrates 102a and 102b respectively, are fixed to the supporting substrate 101 (see FIG. 3B). In addition, the bonding layer 108a between the supporting substrate 101 and the semiconductor substrate 102a, and the bonding layer 108b between the supporting substrate 101 and the semiconductor substrate 102b are heated by this heat treatment, and covalent bonding with higher bonding force than the hydrogen bonding is formed at the bonding interface; therefore, the bonding force at the bonding interface can be increased.

However, a region 105a and a region 105b which are separated from the semiconductor layers 104a and 104b of the semiconductor substrates 102a and 102b respectively are in a state where the regions 105a and 105b can easily move over an air layer formed between separation planes.

Figure 3C:
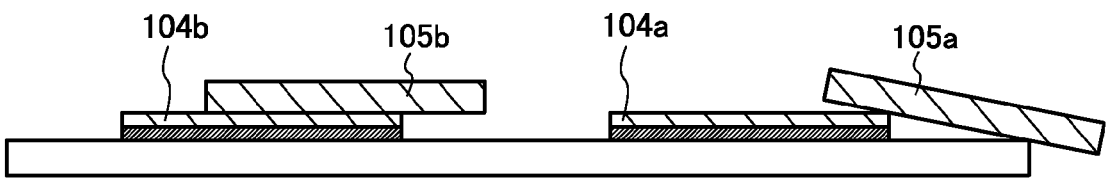

As illustrated in FIG. 3C, when the supporting substrate 101 is larger than each of the semiconductor substrates 102a and 102b, tiny amount of force or minute distortion of the supporting substrate 101 is generated, whereby the region 105b might move outside the semiconductor layer 104b or the region 105a might be detached from the supporting substrate 101.

When the regions 105a and 105b separated from the semiconductor substrates 102a and 102b move in this way, there arise problems in that there is a possibility that the semiconductor layers 104a and 104b formed over the supporting substrate 101 are damaged, and in that it is difficult to collect the supporting substrate 101 and the regions 105a and 105b by carrier devices after heat treatment, and the like.

Thus, a method in which the regions 105a and 105b separated from the semiconductor substrates 102a and 102b do not move from the semiconductor layers 104a and 104b respectively will be described with reference to FIGS. 1A to 1C and FIGS. 7A to 7C.

First, the structure illustrated in FIG. 2D is obtained. Next, a cover 201 formed from quartz is put on the semiconductor substrates 102a and 102b (see FIG. 1A).

As the cover 201, quartz is preferably used in terms of heat resistance and suppression of contamination; however, as long as a material that has no problem in heat resistance and can take measures against contamination is used, quartz is not necessarily used. Alternatively, the cover 201 may be formed from quartz and another material, for example, a metal material having heat resistance.

However, the cover 201 formed from quartz has heat resistance, suppression of contamination, and planarity, and is transparent; therefore, alignment is facilitated when the cover 201 is arranged over a semiconductor substrate.

A depressed portion 202a and a depressed portion 202b are formed in the cover 201 on the surfaces that are in contact with or close to the semiconductor substrates 102a and 102b so as to house the semiconductor substrates 102a and 102b, respectively. The areas of the depressed portions 202a and 202b of the cover 201 are larger than those of the semiconductor substrates 102a and 102b.

As illustrated in FIG. 1A, the depressed portions 202a and 202b are one size larger than the semiconductor substrates 102a and 102b, respectively. Accordingly, the movement of the semiconductor substrates 102a and 102b can be minimally suppressed and the weight of the cover 201 can be sustained by the supporting substrate 101.

Figure 7A:
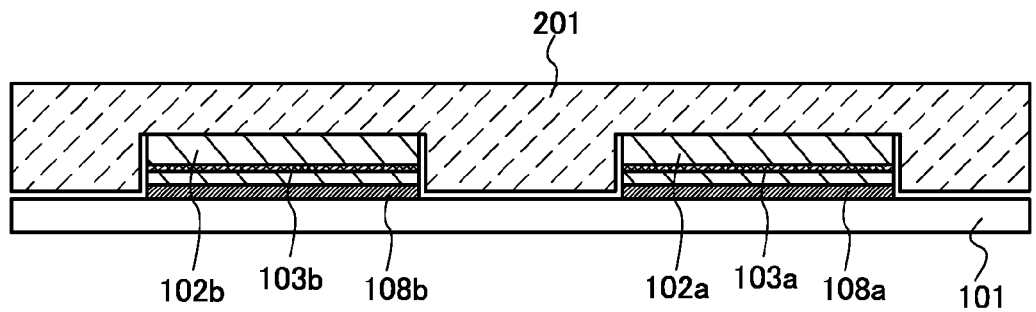
FIGS. 7A to 7C are cross-sectional views illustrating a method for manufacturing a semiconductor layer.

However, the shape of the cover 201 is not limited to the shape illustrated in FIG. 1A. For example, as illustrated in FIG. 7A, the surfaces opposing the surfaces where the bonding layers 108a and 108b of the semiconductor substrates 102a and 102b are formed may be in contact with the cover 201. At this time, the cover 201 is not in contact with the supporting substrate 101, in other words, may be mounted on the semiconductor substrates 102a and 102b. In this case, since the weight of the cover 201 is applied to the semiconductor substrates 102a and 102b, the semiconductor substrates 102a and 102b are less likely to move.

Figure 7B:
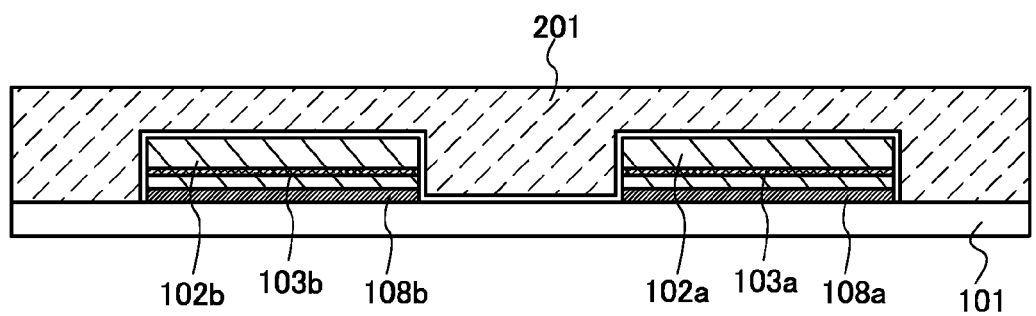

Alternatively, as illustrated in FIG. 7B, the depressed portions 202a and 202b may have one size larger than the semiconductor substrates 102a and 102b, and part of the cover 201 may be in contact with the supporting substrate 101. When the weight of the cover 201 is applied to the semiconductor substrates 102a and 102b, the semiconductor substrates 102a and 102b are less likely to move; at the same time, the semiconductor layers 104a and 104b might be damaged. Therefore, the weight of the cover 201 may be sustained by the supporting substrate 101.

Figure 7C:
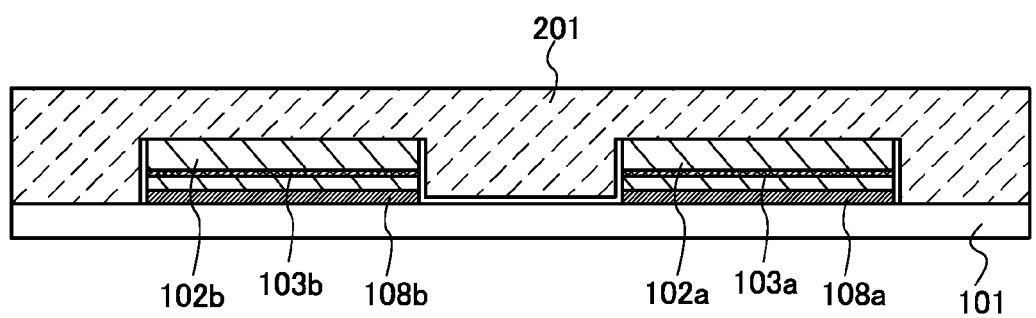

In FIG. 7C, the surfaces opposing the surfaces where the bonding layers 108a and 108b are formed, of the semiconductor substrates 102a and 102b, are in contact with the cover 201, and part of the cover 201 is in contact with the supporting substrate 101. Accordingly, the semiconductor substrates 102a and 102b are less likely to move; at the same time, the weight of the cover 201 can be sustained by the supporting substrate 101.

Next, in a similar manner to the step illustrated in FIG. 3A, volume change is generated in the minute voids formed in the embrittlement layers 103a and 103b by heating, and a crack is generated. As a result, separation of the semiconductor substrates 102a and 102b is performed along the embrittlement layers 103a and 103b (see FIG. 1B).

Figure 1C:
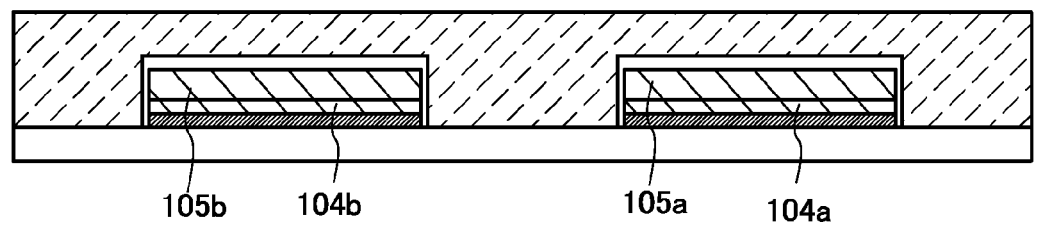

By this heat treatment, the thin film semiconductor layers 104a and 104b which are separated from the semiconductor substrates 102a and 102b respectively are fixed to the supporting substrate 101 (see FIG. 1C). In addition, the bonding layer 108a between the supporting substrate 101 and the semiconductor substrate 102a, and the bonding layer 108b between the supporting substrate 101 and the semiconductor substrate 102b are heated by this heat treatment, and covalent bonding with higher bonding force than the hydrogen bonding is formed at the bonding interface; therefore, the bonding force at the bonding interface can be increased.

When each area of the semiconductor substrates 102a and 102b is about equal to the area of one depressed portion, there is a possibility of causing a problem in that a difference between coefficient of thermal expansion of semiconductor of each of the semiconductor substrates 102a and 102b and that of quartz of the cover 201 at the time of heating is caused and thus one of or both the semiconductor and the quartz is/are broken or the like. Therefore, the area of one depressed portion is preferably larger than that of each of the semiconductor substrates 102a and 102b. As described above, by heat treatment, movement of the regions 105a and 105b separated from the semiconductor substrates 102a and 102b respectively is suppressed.

According to this embodiment, semiconductor layers can be formed over the large supporting substrate 101 from a plurality of semiconductor substrates, and movement of regions separated from the semiconductor substrates can be suppressed. Accordingly, the semiconductor layers can be prevented from being damaged.

Further, it is possible to determine the position of the regions separated from the semiconductor substrates; therefore, the regions separated from the semiconductor substrates are easily collected and transferred using an automatic carrier device.

Embodiment 2

This embodiment will be described with reference to FIGS. 4A and 4B and FIGS. 5A and 5B.

First, a plurality of semiconductor substrates 302 each provided with an embrittlement layer is arranged over a supporting substrate 301 in accordance with FIGS. 2A to 2D described in Embodiment 1. Then, a quartz cover 303 having depressed portions 304 is prepared (see FIG. 4A).

For example, as the supporting substrate 301, a glass substrate which is 600 mm×720 mm and has a thickness of 0.7 mm is prepared. As the semiconductor substrates 302, sixteen silicon wafers each of which is 125 mm×125 mm and has a thickness of 0.7 mm are prepared. The silicon wafer which is 125 mm×125 mm can be formed in such a way that a quadrangular prism which is 125 mm square is cut off from a columnar ingot having a φ of 200 mm and then sliced into a predetermined thickness. Alternatively, the silicon wafer which is 125 mm wide and 125 mm long can be formed in such a way that a silicon wafer having a φ of 200 mm (a φ of 8 inches) is cut off into a rectangular shape. The surface of the silicon wafer which is obtained by being sliced is polished and washed in accordance with a know method, and a silicon wafer having a surface without a defect is formed.

Next, the surface of the silicon wafer is washed and cleaned, and then a protective film is formed over the silicon wafer. The protective film is formed for preventing the silicon wafer from being contaminated with an impurity such as metal, for preventing the surface from being damaged by impact of irradiation ions, and the like in an ion irradiation process to subsequently form an embrittlement layer. This protective film can be formed by depositing an insulating material such as a silicon oxide film, a silicon nitride film, a silicon nitride oxide film, or a silicon oxynitride film by a CVD method or the like. Alternatively, the protective film can be formed by thermal oxidation of the surface of the silicon wafer. In this embodiment, an oxide film is formed by thermal oxidation.

Next, the columnar silicon wafer is irradiated with an ion beam of ions accelerated by an electric field through the protection film, and an embrittlement layer is formed in a region at a predetermined depth from the surface of the silicon wafer. The depth of the region where the embrittlement layer is formed can be controlled by the accelerating energy of the ion beam and the incidence angle thereof. The embrittlement layer is formed in a region at substantially the same depth as average depth to which the ions enter. The thickness of a thin film single crystal silicon layer that is separated from the silicon wafer is determined based on the depth of the embrittlement layer formed. The thickness of the single crystal silicon layer that is separated from the silicon wafer is greater than or equal to 5 nm and less than or equal to 500 nm, and the preferable range of the thickness is greater than or equal to 10 nm and less than or equal to 200 nm. The accelerating voltage of ions is adjusted in consideration of the depth at which ion irradiation is performed.

A hydrogen gas can be used for a source gas in the ion irradiation step. $H^+$, $H_2^+$, and $H_3^+$ are generated from a hydrogen gas ($H_2$ gas). When the hydrogen gas is used as a source gas, it is preferable that $H_3^+$ be the largest number of ions with which the silicon wafer is irradiated. In the case of the irradiation with $H_3^+$ ions, the irradiation efficiency of ions is improved compared to the case of the irradiation with $H^+$ or $H_2^+$, and the irradiation time can be shortened. In addition, a crack is easily formed in the embrittlement layer.

Next, the surface of the glass substrate on a bonding surface side and the surface of the silicon wafer are washed by an ultrasonic cleaning method or the like. Then, when the glass substrate and the silicon wafer are brought close to each other, Van der Waals force acts on an interface between the glass substrate and the bonding layer, so that the glass substrate and the silicon wafer are bonded to each other. The glass substrate and the silicon wafer are brought close to each other, whereby Van der Waals force bonds are formed at the bonding interface and the glass substrate and the silicon wafer are attached to each other. The above process is conducted repeatedly sixteen times, and sixteen silicon wafers are attached to the glass substrate.

In order to prevent a contaminant such as an alkaline component from the glass substrate from being diffused into the silicon wafer, an insulating film which blocks the contaminant, for example, a silicon nitride film including oxygen may be formed on the entire surface of the glass substrate.

Note that in order to form a stronger bonding, for example, the surface of the glass substrate may be subjected to oxygen plasma treatment or ozone treatment, so that the surface can be hydrophilic, or heat treatment or pressure treatment may be conducted after the glass substrate and the bonding layer are brought into close contact.

Next, the quartz cover 303 is put on the semiconductor substrates 302 attached to the supporting substrate 301 (see FIG. 4B). A plurality of depressed portions 304 is formed on the surface of the cover 303 which is in contact with or close to the semiconductor substrates 302 so as to house the semiconductor substrates 302. The area of each of the depressed portions is slightly larger than the area of each of the semiconductor substrates 302. In the case where the area of each of the semiconductor substrates 302 is about equal to the area of each of the depressed portions 304 of the cover 303, there is a possibility of causing a problem in that a difference between coefficient of thermal expansion of semiconductor included in each of the semiconductor substrates 302 and that of quartz included in the cover 303 at the time of heating is caused and either the supporting substrate 301 or at least one of the semiconductor substrates 302 is broken, or the like, which is not preferable.

In this embodiment, silicon wafers each having a bonding surface of 125 mm×125 mm is used as the semiconductor substrates 302; therefore, the area of each of the depressed portions 304 is 127 mm×127 mm. In addition, the depth of each of the depressed portions 304 may be smaller than 0.7 mm which is the thickness of the silicon wafer used. In this embodiment, the depth of each of the depressed portions 304 is 0.4 mm.

Next, heat treatment is performed with the cover 303 put on. The heat temperature can be higher than or equal to 400° C. and lower than 700° C. By performing heat treatment in the temperature range of 400° C. or higher and lower than 700° C., volume change is generated in the minute voids formed in the embrittlement layer in the semiconductor substrate 302, and a crack is generated in the embrittlement layer. As a result, separation of the semiconductor substrates 302 is performed along the embrittlement layer.

By this heat treatment, a thin film semiconductor layer separated from the silicon wafer is fixed to the supporting substrate 301. In addition, the bonding interface between the supporting substrate 301 and each of the semiconductor substrates 302 is heated by this heat treatment, and covalent bonding with higher bonding force than the hydrogen bonding is formed at the bonding interface; therefore, the bonding force at the bonding interface can be increased.

By the heat treatment, each of the semiconductor substrates 302 is separated into two parts such as the semiconductor layer 104a and the region 105a which are separated from the semiconductor substrate 102a, and as the semiconductor layer 104b and the region 105b which are separated from the semiconductor substrate 102b described in Embodiment 1. However, because of the cover 303, the semiconductor substrates 302 which are separated can keep the positions before separation.

Accordingly, the semiconductor layer or the surface of the supporting substrate 301 can be prevented from being damaged due to movement of separated part of the semiconductor substrates 302 (corresponding to the region 105a with respect to the semiconductor substrate 102a). Since the separated part of the semiconductor substrates 302 keeps the position before separation, the part is easily collected by an automatic carrier device.

In addition, another shape of cover, which is different from that of FIGS. 4A and 4B, will be described with reference to FIGS. 5A and 5B.

In FIGS. 4A and 4B, the example is illustrated in which one cover 303 is put on one supporting substrate 301 to which sixteen semiconductor substrates 302 are attached; however, a plurality of covers for one supporting substrate 301 may be formed.

In particular, when a large substrate, for example, a large glass substrate, is used as the supporting substrate 301, there is a possibility that it is difficult to form a quartz cover having the same size. In addition, when the size of a cover is increased, it is difficult to put a cover on a supporting substrate in a state that the semiconductor substrates 302 attached and the depressed portion formed in the cover are accurately aligned. Accordingly, when a larger substrate is used, the method illustrated in FIGS. 5A and 5B can be used.

As illustrated in FIGS. 5A and 5B, one cover is not put on sixteen semiconductor substrates 302, but one cover is put on four semiconductor substrates 302; that is, any of a cover 401a, a cover 401b, a cover 401c, and a cover 401d is put on four semiconductor substrates 302. Each of the covers 401a, 401b, 401c, and 401d is provided with depressed portions 402 for the semiconductor substrates 302.

Each of the covers 401a, 401b, 401c, and 401d may have a size enough to house the plurality of semiconductor substrates 302 and may have weight enough not to be moved easily due to transfer or the like of the supporting substrate 301.

As described above, the cover is downsized, whereby the large supporting substrate 301 can be used. Movement of part separated from the semiconductor substrates 302 (corresponding to the region 105a for the semiconductor substrate 102a) can be suppressed. Accordingly, the semiconductor layers can be prevented from being damaged.

Further, it is possible to determine the position of the part of the semiconductor substrates 302 after separation, whereby the part of the semiconductor substrates 302 is easily collected and transferred by an automatic carrier device. Accordingly, a simpler apparatus structure can be used. Thus, a manufacturing apparatus of a semiconductor layer which has high processing ability at low cost can be realized.

Embodiment 3

This embodiment will be described with reference to FIGS. 6A to 6C. Note that parts like the ones in Embodiment 1 are denoted by the same reference numerals.

Figure 6A:
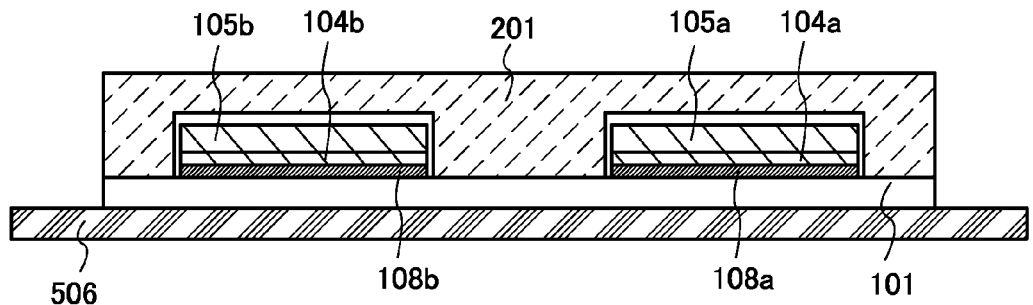
FIGS. 6A to 6C are cross-sectional views illustrating a method for manufacturing a semiconductor layer.

In FIG. 6A, the supporting substrate 101 and the quartz cover 201 are placed over a quartz tray 506. When the size of the supporting substrate 101 is increased, the supporting substrate 101 easily sags due to its own weight; therefore, the supporting substrate 101 can be prevented from sagging in transportation or the like.

Figure 6B:
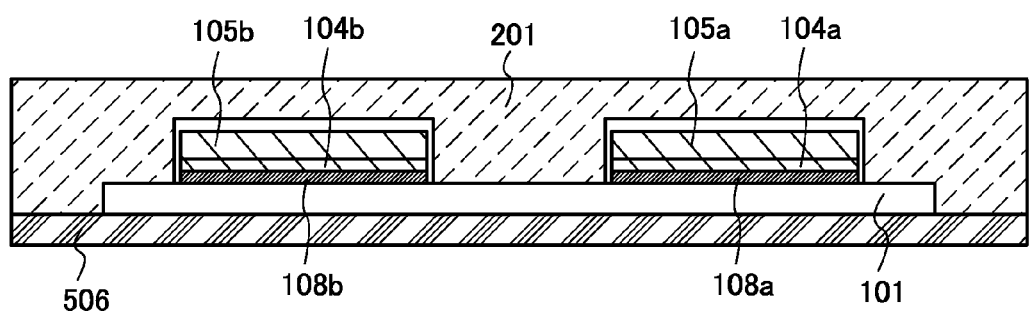

In FIG. 6B, the quartz cover 201 is placed so as to be in contact with the quartz tray 506. Thus, the weight of the cover 201 can be applied not only to the supporting substrate 101 but also to the tray 506; therefore, the supporting substrate 101 can keep a flat state.

Figure 6C:
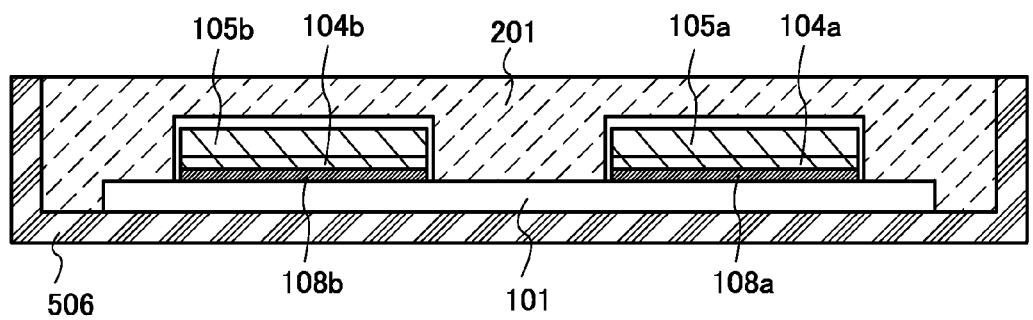

In FIG. 6C, the tray 506 is formed so as to cover the cover 201 and the supporting substrate 101. Thus, positions of the supporting substrate 101, the semiconductor layers 104a and 104b which are fixed to the supporting substrate 101, the regions 105a and 105b which are separated from the semiconductor substrates, and the cover 201 can be prevented from being misaligned.

This application is based on Japanese Patent Application serial No. 2008-219047 filed with Japan Patent Office on Aug. 28, 2008, the entire contents of which are hereby incorporated by reference.

What is claimed is:

1. A method for manufacturing a semiconductor layer, comprising the steps of:
   irradiating a plurality of semiconductor substrates with ions to form embrittlement layers in the plurality of semiconductor substrates;
   forming bonding layers on respective surfaces of the plurality of semiconductor substrates;
   placing, over a supporting substrate, the plurality of semiconductor substrates so that the bonding layers are located between the supporting substrate and the plurality of semiconductor substrates;
   placing a cover including depressed portions which house the plurality of semiconductor substrates over the plurality of semiconductor substrates; and
   heating the plurality of semiconductor substrates housed in the depressed portions of the cover.

2. The method for manufacturing a semiconductor layer according to claim 1, further comprising a step of collecting semiconductor layers fixed to the supporting substrate, and regions separated from the plurality of semiconductor substrates along with the embrittlement layers.

3. The method for manufacturing a semiconductor layer according to claim 1, wherein the cover is a cover formed from quartz.

4. The method for manufacturing a semiconductor layer according to claim 1, wherein the ions are ions selected from hydrogen, deuterium, helium, and halogen.

5. The method for manufacturing a semiconductor layer according to claim 1, wherein each of the semiconductor substrates is a silicon wafer.

6. The method for manufacturing a semiconductor layer according to claim 1, wherein the supporting substrate is a glass substrate.

7. A method for manufacturing a semiconductor device, comprising the steps of:
   irradiating a plurality of semiconductor substrates with ions to form embrittlement layers in the plurality of semiconductor substrates;
   forming bonding layers on respective surfaces of the plurality of semiconductor substrates;
   placing, over a supporting substrate, the plurality of semiconductor substrates so that the bonding layers are located between the supporting substrate and the plurality of semiconductor substrates;
   placing a cover including depressed portions which house the plurality of semiconductor substrates over the plurality of semiconductor substrates; and
   heating the plurality of semiconductor substrates housed in the depressed portions of the cover.

8. The method for manufacturing a semiconductor layer according to claim 7, further comprising a step of collecting semiconductor layers fixed to the supporting substrate, and regions separated from the plurality of semiconductor substrates along with the embrittlement layers.

9. The method for manufacturing a semiconductor device according to claim 7, wherein the cover is a cover formed from quartz.

10. The method for manufacturing a semiconductor device according to claim 7, wherein the ions are ions selected from hydrogen, deuterium, helium, and halogen.

11. The method for manufacturing a semiconductor device according to claim 7, wherein each of the semiconductor substrates is a silicon wafer.

12. The method for manufacturing a semiconductor device according to claim 7, wherein the supporting substrate is a glass substrate.

13. A method for manufacturing a semiconductor layer, comprising the steps of:
   irradiating a plurality of semiconductor substrates with ions to form embrittlement layers in the plurality of semiconductor substrates;
   forming bonding layers on respective surfaces of the plurality of semiconductor substrates;
   placing, over a supporting substrate, the plurality of semiconductor substrates so that the bonding layers are located between the supporting substrate and the plurality of semiconductor substrates;
   placing a cover over the plurality of semiconductor substrates in order to fix the plurality of semiconductor substrates over the supporting substrate; and
   heating the plurality of semiconductor substrates housed in the depressed portions of the cover.

14. The method for manufacturing a semiconductor layer according to claim 13, further comprising a step of collecting semiconductor layers fixed to the supporting substrate, and regions separated from the plurality of semiconductor substrates along with the embrittlement layers.

15. The method for manufacturing a semiconductor layer according to claim 13, wherein the cover is a cover formed from quartz.

16. The method for manufacturing a semiconductor layer according to claim 13, wherein the ions are ions selected from hydrogen, deuterium, helium, and halogen.

17. The method for manufacturing a semiconductor layer according to claim 13, wherein each of the semiconductor substrates is a silicon wafer.

18. The method for manufacturing a semiconductor layer according to claim 13, wherein the supporting substrate is a glass substrate.

19. A method for manufacturing a semiconductor device, comprising the steps of:
   irradiating a plurality of semiconductor substrates with ions to form embrittlement layers in the plurality of semiconductor substrates;
   forming bonding layers on respective surfaces of the plurality of semiconductor substrates;
   placing, over a supporting substrate, the plurality of semiconductor substrates so that the bonding layers are located between the supporting substrate and the plurality of semiconductor substrates;
   placing a cover over the plurality of semiconductor substrates in order to fix the plurality of semiconductor substrates over the supporting substrate; and
   heating the plurality of semiconductor substrates housed in the depressed portions of the cover.

20. The method for manufacturing a semiconductor layer according to claim 19, further comprising a step of collecting semiconductor layers fixed to the supporting substrate, and regions separated from the plurality of semiconductor substrates along with the embrittlement layers.

21. The method for manufacturing a semiconductor device according to claim 19, wherein the cover is a cover formed from quartz.

22. The method for manufacturing a semiconductor device according to claim 19, wherein the ions are ions selected from hydrogen, deuterium, helium, and halogen.

23. The method for manufacturing a semiconductor device according to claim 19, wherein each of the semiconductor substrates is a silicon wafer.

24. The method for manufacturing a semiconductor device according to claim 19, wherein the supporting substrate is a glass substrate.

* * * * *